United States Patent
Kohno

(10) Patent No.: US 10,714,308 B2
(45) Date of Patent: Jul. 14, 2020

(54) MEASUREMENT METHOD AND ELECTRON MICROSCOPE

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 22 days.

(21) Appl. No.: 16/131,677

(22) Filed: Sep. 14, 2018

(65) Prior Publication Data

US 2019/0088447 A1 Mar. 21, 2019

(30) Foreign Application Priority Data

Sep. 15, 2017 (JP) ................. 2017-178196

(51) Int. Cl.
*H01J 37/28* (2006.01)
*H01J 37/24* (2006.01)
*H01J 37/26* (2006.01)
*H01J 37/244* (2006.01)

(52) U.S. Cl.
CPC ............ *H01J 37/28* (2013.01); *H01J 37/244* (2013.01); *H01J 37/265* (2013.01); *H01J 2237/0492* (2013.01); *H01J 2237/1505* (2013.01); *H01J 2237/24465* (2013.01); *H01J 2237/24564* (2013.01); *H01J 2237/2614* (2013.01); *H01J 2237/2802* (2013.01); *H01J 2237/2826* (2013.01)

(58) Field of Classification Search
CPC ....... H01J 2237/244; H01J 2237/24435; H01J 2237/24455; H01J 2237/2446; H01J 2237/24465; H01J 2237/24528; H01J 37/24; H01J 37/26; H01J 37/28; H01J 37/244; H01J 37/265
See application file for complete search history.

(56) References Cited

U.S. PATENT DOCUMENTS

2016/0225580 A1* 8/2016 Kohno .................. H01J 37/222
2016/0254118 A1* 9/2016 Kohno .................. H01J 37/222
                                                              250/307

FOREIGN PATENT DOCUMENTS

JP          2011243516 A      12/2011

* cited by examiner

*Primary Examiner* — Wyatt A Stoffa
*Assistant Examiner* — Sean M Luck
(74) *Attorney, Agent, or Firm* — The Webb Law Firm

(57) ABSTRACT

Provided is a measurement method for measuring, in an electron microscope including a segmented detector having a detection plane segmented into a plurality of detection regions, a direction of each of the plurality of detection regions in a scanning transmission electron microscope (STEM) image, the measurement method including: shifting an electron beam EB incident on a sample S under a state where the detection plane is conjugate to a plane shifted from a diffraction plane to shift the electron beam EB on the detection plane, and measuring a shift direction of the electron beam EB on the detection plane with the segmented detector; and obtaining the direction of each of the plurality of detection regions in the STEM image from the shift direction.

9 Claims, 23 Drawing Sheets

MEASURE SHIFT DIRECTION OF ELECTRON BEAM ON DETECTION PLANE BY SHIFTING ELECTRON BEAM INCIDENT ON SAMPLE UNDER STATE WHERE DETECTION PLANE OF SEGMENTED DETECTOR IS CONJUGATE TO PLANE SHIFTED FROM DIFFRACTION PLANE — S10

OBTAIN DIRECTION OF DETECTION REGION FROM SHIFT DIRECTION OF ELECTRON BEAM — S12

MEASUREMENT METHOD AND ELECTRON MICROSCOPE

CROSS-REFERENCE TO RELATED APPLICATIONS

This application claims priority to Japanese Patent Application No. 2017-178196 filed Sep. 15, 2017, the disclosure of which is hereby incorporated in its entirety by reference.

Japanese Patent Application No. 2017-178196, filed on Sep. 15, 2017, is hereby incorporated by reference in its entirety.

BACKGROUND OF THE INVENTION

The present invention relates to a measurement method and an electron microscope.

A scanning transmission electron microscope (STEM) is an electron microscope configured to perform scan on a sample with a converged electron beam, and map, in synchronization with the scan, the strength of detection signals based on transmitted electrons or scattered electrons from the sample, to thereby obtain a scanning transmission electron microscope image (STEM image). The scanning transmission electron microscope has attracted attention in recent years as an electron microscope capable of obtaining quite high spatial resolution at an atomic level.

As an electron detector that is mounted on such a scanning transmission electron microscope, there has been known a segmented detector having a detection plane segmented into a plurality of detection regions. The segmented detector includes independent detection systems for the plurality of segmented detection regions, and each detection system only detects electrons incident on a specific detection region on the detection plane. In the scanning transmission electron microscope, the detection plane and a diffraction plane are matched with each other (are conjugate planes). This corresponds to that electrons having passed through or scattered from the sample to enter specific solid angle regions are detected. Using the segmented detector therefore has an advantage that pieces of information on the solid angle dependence of electron scattering due to the sample can be simultaneously obtained to be quantitatively evaluated (for example, see JP-A-2011-243516).

FIG. 14 is a diagram illustrating the operation of a related-art scanning transmission electron microscope 101 including a segmented detector. In FIG. 14, only the main part of the scanning transmission electron microscope 101 is illustrated.

In the scanning transmission electron microscope 101, as illustrated in FIG. 14, an electron beam EB is converged on the surface of a sample S by an illumination-lens system 102. Then, the electron beam EB having passed through the sample S is detected by a segmented detector 106 after the camera length is adjusted by an imaging lens system 104. A charge coupled device (CCD) camera 108 is placed behind the segmented detector 106.

As a method for visualizing the electromagnetic field of a sample with the use of the scanning transmission electron microscope including the segmented detector as described above, there has been known the differential phase contrast (DPC) method. This method includes measuring how much an electron beam is deflected when passing through a sample, and calculating, on the basis of the measurement result, the electromagnetic field of the sample that causes the deflection of the electron beam.

When measurement is performed by the DPC method, the direction of a detection region of the segmented detector needs to be adjusted with respect to a STEM image. When the direction of the detection region of the segmented detector in the STEM image is unknown, the direction of an electromagnetic field that acts on an electron beam having passed through a sample, thereby deflecting the electron beam cannot be identified.

FIG. 15 is a diagram illustrating an example of the relationship between the crystal orientations of the sample S and the relative orientations of detection regions D1, D2, D3, and D4 of the segmented detector 106. FIG. 16 is a diagram schematically illustrating an image I (D2-D4) based on a difference between a STEM image obtained in the detection region D2 and a STEM image obtained in the detection region D4, and an image I (D1-D3) based on a difference between a STEM image obtained in the detection region D1 and a STEM image obtained in the detection region D3.

As illustrated in FIG. 15, for example, the detection regions D1, D2, D3, and D4 are arranged so that the detection regions D2 and D4 are placed in a [110] direction, and the detection regions D1 and D3 are placed in a [−110] direction. Photography is performed under this state, and a STEM image is obtained for each of the detection regions D1, D2, D3, and D4. The image I (D2-D4) and the image I (D1-D3) illustrated in FIG. 16 are then generated. An X direction of the photographed STEM image corresponds to the [110] direction of the sample S, and a Y direction of the STEM image corresponds to the [−110] direction of the sample S.

From the image I (D2-D4), which is illustrated in FIG. 16, information on deflection in the [110] direction that is caused when the electron beam passes through the sample can be obtained, and from the image I (D1-D3), information on deflection in the [−110] direction can be obtained. On the basis of the relationship between the crystal orientations and the deflection, the distribution of the electromagnetic field in the sample can be grasped.

Here, description is given on an example of a method for measuring the direction of each of the detection regions D1, D2, D3, and D4 of the segmented detector 106 in a STEM image. FIG. 17 to FIG. 23 are diagrams illustrating an example of the measurement method.

In order to grasp the direction of each of the detection regions D1, D2, D3, and D4 of the segmented detector 106 in the STEM image, first, the imaging lens system 104 is adjusted so that the surface of a sample is conjugate to a detection plane 105 as illustrated in FIG. 17. When scan is performed under this state, an image I1 having the shape of the detection plane 105 can be obtained as illustrated in FIG. 18. In addition, the segmented detector 106 is retracted, for example, and an image 12 (see FIG. 19) of a probe being scanned by the CCD camera 108 is obtained. In this way, a scan region can be confirmed. When these images are combined, the relationship between the direction of each of the detection regions D1, D2, D3, and D4 of the detection plane 105 and the direction of the CCD camera 108 is grasped as illustrated in FIG. 20.

Next, the scanning transmission electron microscope 101 is returned to the setting for obtaining a STEM image illustrated in FIG. 14. Under this condition, as illustrated in FIG. 21, an image 14 that is an image of the shadow of the illumination system's aperture (not shown) is observed. When defocus is added so that the detection plane 105 is shifted from the diffraction plane, the shadow of the aperture is moved along with the scan. For example, when photography is performed with long exposure time by performing scan only in the X direction, as illustrated in FIG. 22, an image I5 that indicates the locus of the shadow of the aperture is obtained. From a direction A of the movement of the shadow of the aperture and the direction of each of the detection regions D1, D2, D3, and D4 of the detection plane 105 in an image 13, which is illustrated in FIG. 20, the directions of the detection regions D1, D2, D3, and D4 of the segmented detector 106 in the STEM image can be grasped as illustrated in FIG. 23. The direction A illustrated in FIG. 23 corresponds to the X direction of the STEM image.

In this way, in the above-mentioned method for measuring the direction of the detection region in the STEM image, the direction of the detection region with respect to the STEM image (scanning direction) is measured in the two stages, that is, the direction of the CCD camera with respect to the segmented detector, and the scanning direction with respect to the segmented detector. Thus, in such a measurement method, it takes long time to only obtain the images I1 to I5 necessary for measurement. The direction of the detection region of the segmented detector in the STEM image is changed also when the scanning direction is changed. Performing the above-mentioned measurement every time the scanning direction is changed puts a heavy burden on a user. Further, in such a measurement method, the CCD camera is necessary.

SUMMARY OF THE INVENTION

The invention can provide a measurement method enabling easy measurement of the direction of a detection region of a segmented detector in a scanning transmission electron microscope image. Further, the invention can provide an electron microscope capable of easily measuring the direction of a detection region of a segmented detector in a scanning transmission electron microscope image.

According to a first aspect of the invention, there is provided a measurement method for measuring, in an electron microscope including a segmented detector having a detection plane segmented into a plurality of detection regions, a direction of each of the plurality of detection regions in a scanning transmission electron microscope (STEM) image, the measurement method including:

shifting an electron beam incident on a sample under a state where the detection plane is conjugate to a plane shifted from a diffraction plane to shift the electron beam on the detection plane, and measuring a shift direction of the electron beam on the detection plane with the segmented detector; and obtaining the direction of each of the plurality of detection regions in the STEM image from the shift direction.

According to a second aspect of the invention, there is provided a measurement method for measuring, in an electron microscope including a segmented detector having a detection plane segmented into a plurality of detection regions, a direction of each of the plurality of detection regions in a scanning transmission electron microscope (STEM) image, the measurement method including:

scanning an incident angle of an electron beam incident on a sample to shift the electron beam on the detection plane, and measuring a shift direction of an electron beam on the detection plane with the segmented detector; and obtaining the direction of each of the plurality of detection regions in the STEM image from the shift direction.

According to a third aspect of the invention, there is provided an electron microscope that detects an electron having passed through a sample to obtain a scanning transmission electron microscope (STEM) image, the electron microscope including:

a segmented detector having a detection plane for detecting an electron beam having passed through the sample, the detection plane being segmented into a plurality of detection regions; and a computation unit that obtains a direction of each of the plurality of detection regions in the STEM image, and the computation unit performing processing of:

shifting an electron beam incident on the sample under a state where the detection plane is conjugate to a plane shifted from a diffraction plane to shift the electron beam on the detection plane, and obtaining a result of measuring a shift direction of the electron beam on the detection plane with the segmented detector; and obtaining the direction of each of the plurality of detection regions in the STEM image from the obtained shift direction.

According to a fourth aspect of the invention, there is provided an electron microscope that detects an electron having passed through a sample to obtain a scanning transmission electron microscope (STEM) image, the electron microscope including:

a segmented detector having a detection plane for detecting an electron beam having passed through the sample, the detection plane being segmented into a plurality of detection regions; and a computation unit that obtains a direction of each of the plurality of detection regions in the STEM image, and the computation unit performing processing of:

scanning an incident angle of an electron beam incident on the sample to shift the electron beam on the detection plane, and obtaining a result of measuring a shift direction of the electron beam on the detection plane with the segmented detector; and obtaining the direction of each of the plurality of detection regions in the STEM image from the obtained shift direction.

DESCRIPTION OF THE INVENTION

Figure 1:
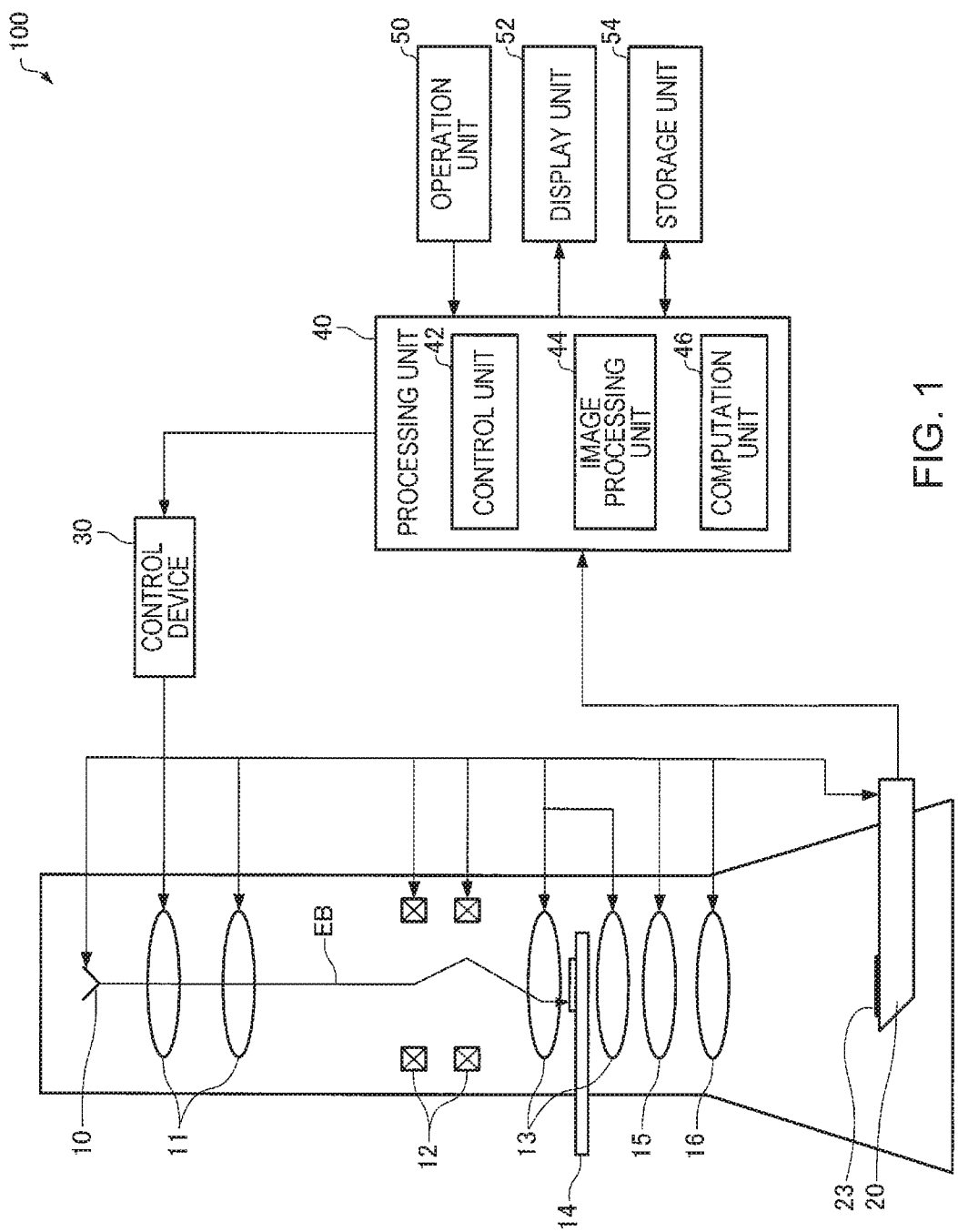
FIG. 1 is a diagram illustrating the configuration of an electron microscope according to one embodiment of the invention.

According to one embodiment of the invention, there is provided a measurement method for measuring, in an electron microscope including a segmented detector having a detection plane segmented into a plurality of detection regions, a direction of each of the plurality of detection regions in a scanning transmission electron microscope (STEM) image, the measurement method including:

shifting an electron beam incident on a sample under a state where the detection plane is conjugate to a plane shifted from a diffraction plane to shift the electron beam on the detection plane, and measuring a shift direction of the electron beam on the detection plane with the segmented detector; and obtaining the direction of each of the plurality of detection regions in the STEM image from the shift direction.

With such a measurement method, the direction of the detection region in a scanning transmission electron microscope image can be easily measured. Further, with the measurement method, the direction of the detection region in a scanning transmission electron microscope image can be measured without using a device such as a CCD camera.

According to one embodiment of the invention, there is provided a measurement method for measuring, in an electron microscope including a segmented detector having a detection plane segmented into a plurality of detection regions, a direction of each of the plurality of detection regions in a scanning transmission electron microscope (STEM) image, the measurement method including:

scanning an incident angle of an electron beam incident on a sample to shift the electron beam on the detection plane, and measuring a shift direction of the electron beam on the detection plane with the segmented detector; and obtaining the direction of each of the plurality of detection regions in the STEM image from the shift direction.

With such a measurement method, the direction of the detection region in a STEM image can be easily measured. Further, with the measurement method, the direction of the detection region in a STEM image can be measured without using a device such as a CCD camera.

According to one embodiment of the invention, there is provided an electron microscope that detects an electron having passed through a sample to obtain a scanning transmission electron microscope (STEM) image, the electron microscope including:

a segmented detector having a detection plane for detecting an electron beam having passed through the sample, the detection plane being segmented into a plurality of detection regions; and a computation unit that obtains a direction of each of the plurality of detection regions in the STEM image, and the computation unit performing processing of:

shifting an electron beam incident on the sample under a state where the detection plane is conjugate to a plane shifted from a diffraction plane to shift the electron beam on the detection plane, and obtaining a result of measuring a shift direction of the electron beam on the detection plane with the segmented detector; and obtaining the direction of each of the plurality of detection regions in the STEM image from the obtained shift direction.

With such an electron microscope, the direction of the detection region in a STEM image can be easily measured. Further, with the electron microscope, the direction of the detection region in a STEM image can be measured without using a device such as a CCD camera.

According to one embodiment of the invention, there is provided an electron microscope that detects an electron having passed through a sample to obtain a scanning transmission electron microscope (STEM) image, the electron microscope including:

a segmented detector having a detection plane for detecting an electron beam having passed through the sample, the detection plane being segmented into a plurality of detection regions; and a computation unit that obtains a direction of each of the plurality of detection regions in the STEM image, and the computation unit performing processing of:

scanning an incident angle of an electron beam incident on the sample to shift the electron beam on the detection plane, and obtaining a result of measuring a shift direction of the electron beam on the detection plane with the segmented detector; and obtaining the direction of each of the plurality of detection regions in the STEM image from the obtained shift direction.

With such an electron microscope, the direction of the detection region in a STEM image can be easily measured. Further, with the electron microscope, the direction of the detection region in a STEM image can be measured without using a device such as a CCD camera.

Embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

1. Electron Microscope

First, an electron microscope according to one embodiment of the invention is described with reference to the drawings. FIG. 1 is a diagram illustrating the configuration of an electron microscope 100 according to the present embodiment.

The electron microscope 100 includes, as illustrated in FIG. 1, an electron source 10, an illumination-lens system 11, a scanning deflector 12, an objective lens 13, a sample stage 14, an intermediate lens 15, a projection lens 16, a segmented detector 20, a control device 30, a processing unit 40, an operation unit 50, a display unit 52, and a storage unit 54.

The electron source 10 generates an electron beam EB. The electron source 10 is, for example, an electron gun configured to accelerate, by an anode, electrons emitted from a cathode, thereby emitting the electron beam EB.

The illumination-lens system 11 converges the electron beam EB generated by the electron source 10. The scanning deflector 12 deflects the electron beam EB emitted from the electron source 10. When the scanning deflector 12 is supplied with a scanning signal from the control device 30, scan can be performed on the sample S with the converged electron beam EB. With this, the electron microscope 100 can function as a scanning transmission electron microscope (STEM).

The objective lens 13 converges the electron beam EB on the sample S. Further, the objective lens 13 forms an image with electrons having passed through the sample S.

The sample stage 14 holds the sample S. Further, the sample stage 14 can move the sample S in a horizontal direction or a vertical direction, or incline the sample S.

The intermediate lens 15 and the projection lens 16 project (form) the image, which is formed by the objective lens 13, on a detection plane 23 of the segmented detector 20.

Figure 2:
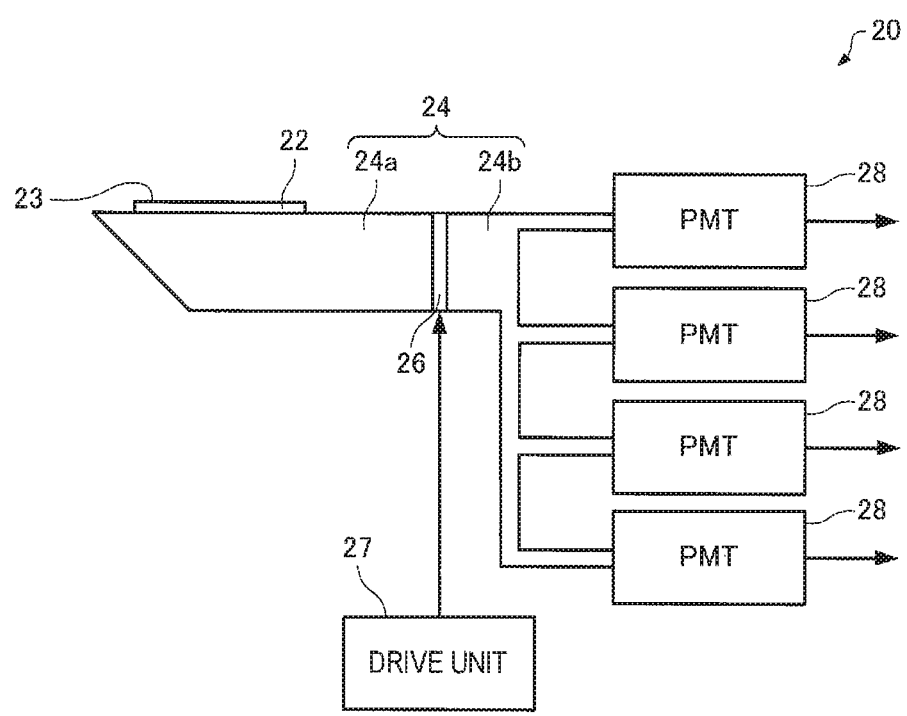
FIG. 2 is a diagram schematically illustrating the configuration of a segmented detector.
Figure 3:
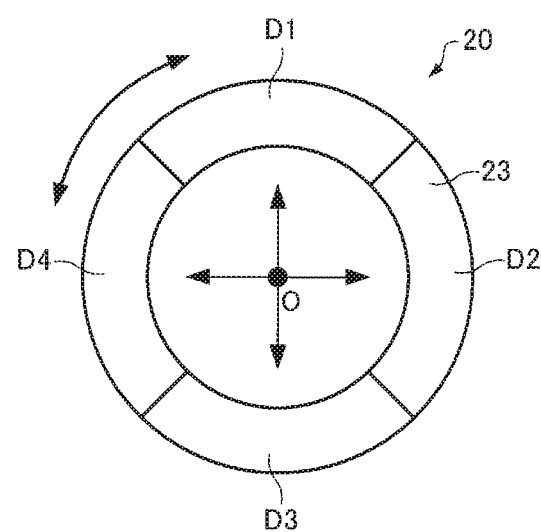
FIG. 3 is a diagram schematically illustrating a detection plane of the segmented detector.

The segmented detector 20 is provided behind the projection lens 16 (on the downstream of the electron beam EB). The segmented detector 20 detects electrons having passed through the sample S. FIG. 2 is a diagram schematically illustrating the configuration of the segmented detector 20. FIG. 3 is a diagram schematically illustrating the detection plane 23 of the segmented detector 20.

The segmented detector 20 includes, as illustrated in FIG. 2 and FIG. 3, an electron-light conversion element 22 configured to convert an electron beam to light, an optical transmission path 24 configured to segment the electron-light conversion element 22 into four detection regions D1, D2, D3, and D4 and transmit light from each of the detection regions D1, D2, D3, and D4, and four photodetectors 28 each configured to convert light, which is transmitted from each of the detection regions D1, D2, D3, and D4 through the optical transmission path 24, to an electric signal.

The electron-light conversion element 22 is, for example, a scintillator or a fluorescent screen, and converts electrons incident thereon to light having an intensity that the photodetector 28, which is provided on the subsequent stage of the electron-light conversion element 22, can detect.

The optical transmission path 24 is an optical fiber bundle formed by bundling a large number of optical fibers. The optical fibers of the optical transmission path 24 are bundled to one on an end portion on the electron-light conversion element 22 side to receive light from the entire surface of the electron-light conversion element 22, and are separated on the opposite end portion to transmit received light to the respective photodetectors 28 depending on the reception positions of the light. That is, the optical transmission path 24 is configured so that the light emission surface of the electron-light conversion element 22 serves as the detection plane 23, and the detection plane 23 is segmented into the four detection regions D1, D2, D3, and D4.

Further, the optical transmission path 24 has a rotation unit 26 configured to change the transmission path of light, thereby rotating the four detection regions D1, D2, D3, and D4 in the electron beam incident surface of the electron-light conversion element 22. The optical transmission path 24 includes an optical transmission path 24a placed on the vacuum side and an optical transmission path 24b placed on the atmosphere side. The optical transmission path 24a and the optical transmission path 24b are connected to each other by the rotation unit 26 so as to be rotatable. The rotation unit 26 can rotate, while maintaining the central axis of the entire optical transmission path 24, the optical transmission path 24b about the central axis. With this rotation, the detection regions D1, D2, D3, and D4 can be rotated.

A drive unit 27 can operate the rotation unit 26 to rotate the optical transmission path 24b.

The photodetector 28 is, for example, a complex device including a photomultiplier tube (PMT) and a preamplifier, and converts light emitted from the separated optical fibers of the optical transmission path 24 to an electric signal, and amplifies the electric signal. This signal is input to the processing unit 40 as a detection signal of an electron beam incident on each of the detection regions D1, D2, D3, and D4.

The number of segments in the detection plane 23, that is, the number of detection regions are not particularly limited. The detection plane 23 may be partitioned in its radial direction and direction of angle of deviation (circumferential direction) so that the segmented detector 20 may have a plurality of detection regions. For example, the detection plane 23 may be segmented into four in the radial direction and segmented into four in the direction of angle of deviation so that the segmented detector 20 may have 16 detection regions.

The control device 30 operates, as illustrated in FIG. 1, the electron source 10, the optical systems 11, 12, 13, 15, and 16, and the drive unit 27 (see FIG. 2) of the segmented detector 20. The control device 30 operates, on the basis of a control signal from a control unit 42, the electron source 10, the optical systems 11, 12, 13, 15, and 16, and the drive unit 27.

The operation unit 50 performs the processing of obtaining an operation signal based on an operation made by a user, and sending the operation signal to the processing unit 40. The operation unit 50 is, for example, a button, a key, a touch screen display, or a microphone.

The display unit 52 displays an image generated by the processing unit 40. The function of the display unit 52 can be implemented by an LCD, a CRT, or the like.

The storage unit 54 stores programs, data, and the like for the processing unit 40 to perform various kinds of calculation processing and control processing. Further, the storage unit 54 is used as a work area of the processing unit 40, and is also used for temporarily storing, for example, the result of calculation that the processing unit 40 executes on the basis of the various programs. The function of the storage unit 54 can be implemented by a memory (storage device) such as a hard disk or a random access memory (RAM).

The processing unit 40 performs various kinds of control processing and calculation processing on the basis of the programs stored in the storage unit 54. The processing unit 40 executes the programs stored in the storage unit 54, to thereby function as the control unit 42, an image processing unit 44, and a computation unit 46, which are described below. The function of the processing unit 40 can be implemented by various processors (central processing unit (CPU), for example) executing the programs. At least part of the function of the processing unit 40 may be implemented by a dedicated circuit such as an ASIC (gate array, for example). The processing unit 40 includes the control unit 42, the image processing unit 44, and the computation unit 46.

The control unit 42 performs processing of generating a control signal for controlling the operation of the electron source 10, the optical systems 11, 12, 13, 15, and 16 that are included in the electron microscope 100, and the drive unit 27 of the segmented detector 20. The control unit 42 performs the processing of generating a control signal in response to an instruction issued by the user via the operation unit 50, for example, and sending the control signal to the control device 30.

The image processing unit 44 performs the processing of generating a STEM image by using an output signal from the segmented detector 20. The image processing unit 44 can perform, for example, the processing of generating STEM images in a bright field for the respective detection regions D1, D2, D3, and D4 of the segmented detector 20, and the processing of generating an image (DPC image) by performing addition or subtraction of detection signals from the detection regions D1, D2, D3, and D4, for example. A DPC image is an image representing the distribution of the electromagnetic field of the sample S, which is obtained by the DPC method. The image processing unit 44 generates a DPC image by using, for example, the directions of the detection regions D1, D2, D3, and D4 (angle α described later) of the segmented detector 20 in the STEM image, which are obtained by the computation unit 46.

The computation unit 46 performs the processing of obtaining the directions of the detection regions D1, D2, D3, and D4 of the segmented detector 20 in the STEM image. The details of the processing by the computation unit 46 are described later.

2. Measurement Method

Next, a measurement method according to one embodiment of the invention is described. In the following, as the measurement method according to the present embodiment, a case where, in the electron microscope 100, the directions of the detection regions D1, D2, D3, and D4 of the segmented detector 20 in the STEM image are obtained.

Here, the directions of the detection regions D1, D2, D3, and D4 of the segmented detector 20 are, for example, as indicated by the arrows in FIG. 3, the directions of the detection regions D1, D2, D3, and D4 seen from a center O of the detection plane 23. The directions of the detection regions D1, D2, D3, and D4 of the segmented detector 20 in the STEM image can be paraphrased as the directions of the detection regions D1, D2, D3, and D4 of the segmented detector 20 with respect to the scanning direction of the electron beam EB incident on the sample S.

With the measurement method according to the present embodiment, there can be grasped a direction in the STEM image that corresponds to the shift direction of the electron beam EB detected by the segmented detector 20 (that is, the direction of deflection of the electron beam EB due to the electromagnetic field of the sample S).

Figure 4:
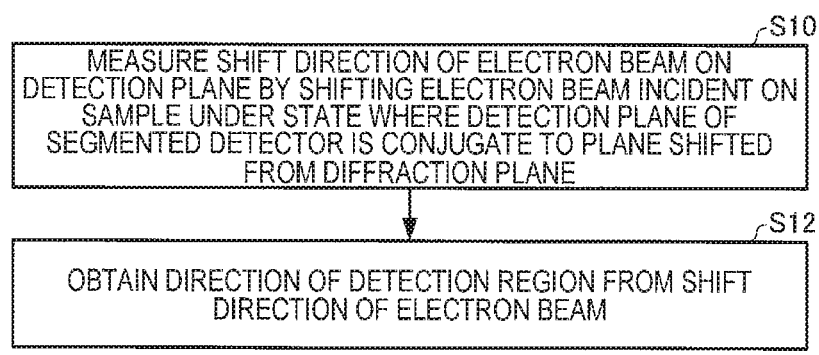
FIG. 4 is a flowchart illustrating an example of a measurement method according to one embodiment of the invention.

FIG. 4 is a flowchart for illustrating an example of the measurement method according to the present embodiment. As illustrated in FIG. 4, the measurement method according to the present embodiment includes: a step (S10) of measuring the shift direction of the electron beam EB on the detection plane 23 with the segmented detector 20, by shifting the electron beam EB incident on the sample S under a state where, with the use of the imaging lens system, the detection plane 23 of the segmented detector 20 is conjugate to a plane shifted from a diffraction plane, to thereby shift the electron beam on the detection plane 23; and a step (S12) of obtaining the directions of the detection regions D1, D2, D3, and D4 in the STEM image from the measured shift direction of the electron beam EB on the detection plane 23.

Now, the measurement method according to the present embodiment is described in detail.

With the use of the segmented detector 20, a signal from each of the plurality of detection regions D1, D2, D3, and D4 can be computed, and the amount of shift and the shift direction of the electron beam EB on the detection plane 23 can be measured.

Figure 5:
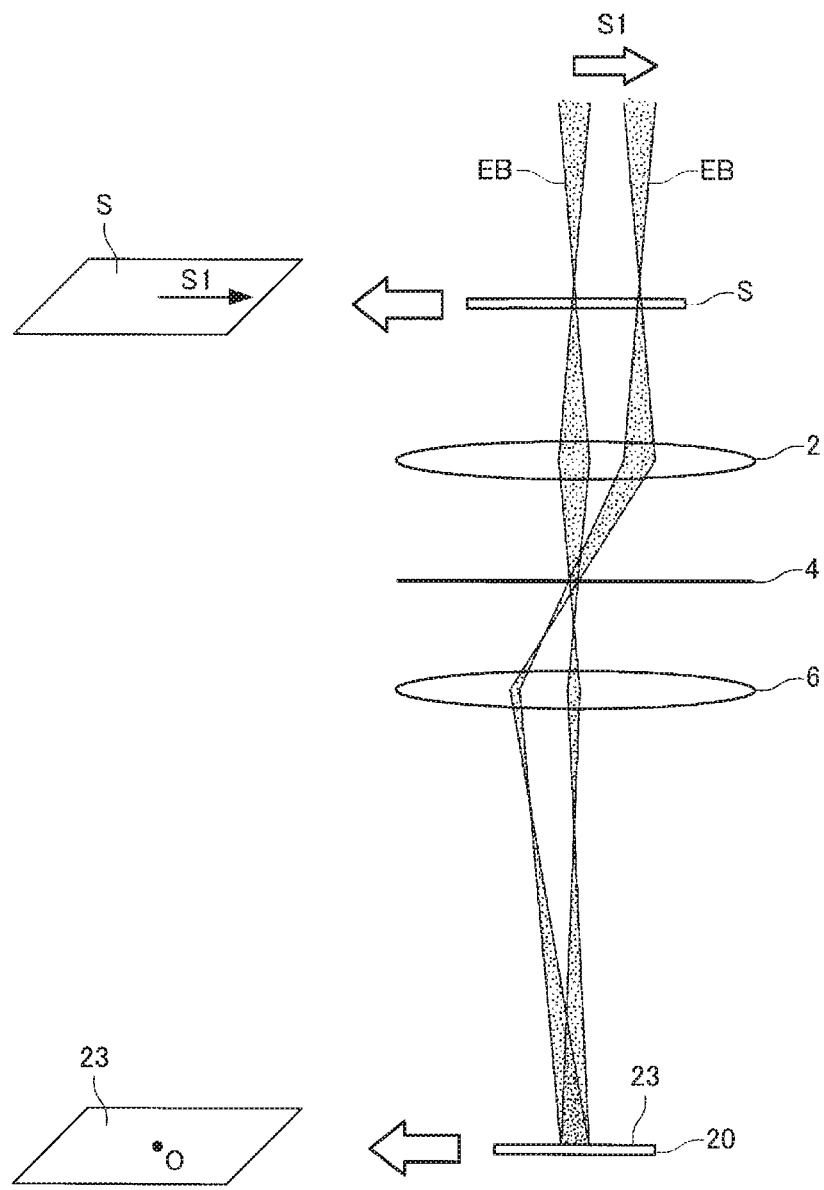
FIG. 5 is a diagram schematically illustrating a state where a normal STEM image is being obtained.
Figure 6:
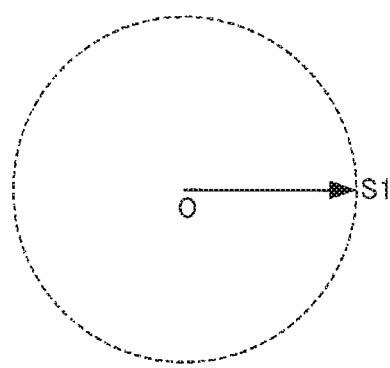
FIG. 6 is a diagram schematically illustrating the state where the normal STEM image is being obtained.

FIG. 5 and FIG. 6 are diagrams schematically illustrating a state where a normal STEM image (a STEM image in a bright field) is being obtained. In FIG. 5, the illustrations of optical systems other than an imaging lens 2 (objective lens 13) and an imaging lens system 6 (intermediate lens 15 and projection lens 16) are omitted. A diffraction plane 4 is the back focal plane of the objective lens 13, and is a plane where an electron diffraction pattern is obtained. Further, FIG. 6 is a diagram illustrating a shift direction (scanning direction or direction S1) of the electron beam EB incident on the sample S and a shift direction (direction S2) of the electron beam EB on the detection plane 23.

Under the condition of the optical systems for obtaining a normal STEM image, as illustrated in FIG. 5, the diffraction plane 4 and the detection plane 23 are conjugate to each other. Thus, even when the electron beam EB incident on the sample S is shifted (that is, scan is performed with the electron beam EB), a position of the beam on the detection plane 23 is not changed. In the illustrated example, the electron beam EB incident on the sample S is shifted in the direction S1, but the electron beam EB on the detection plane 23 is not moved from the center O of the detection plane 23.

Figure 7:
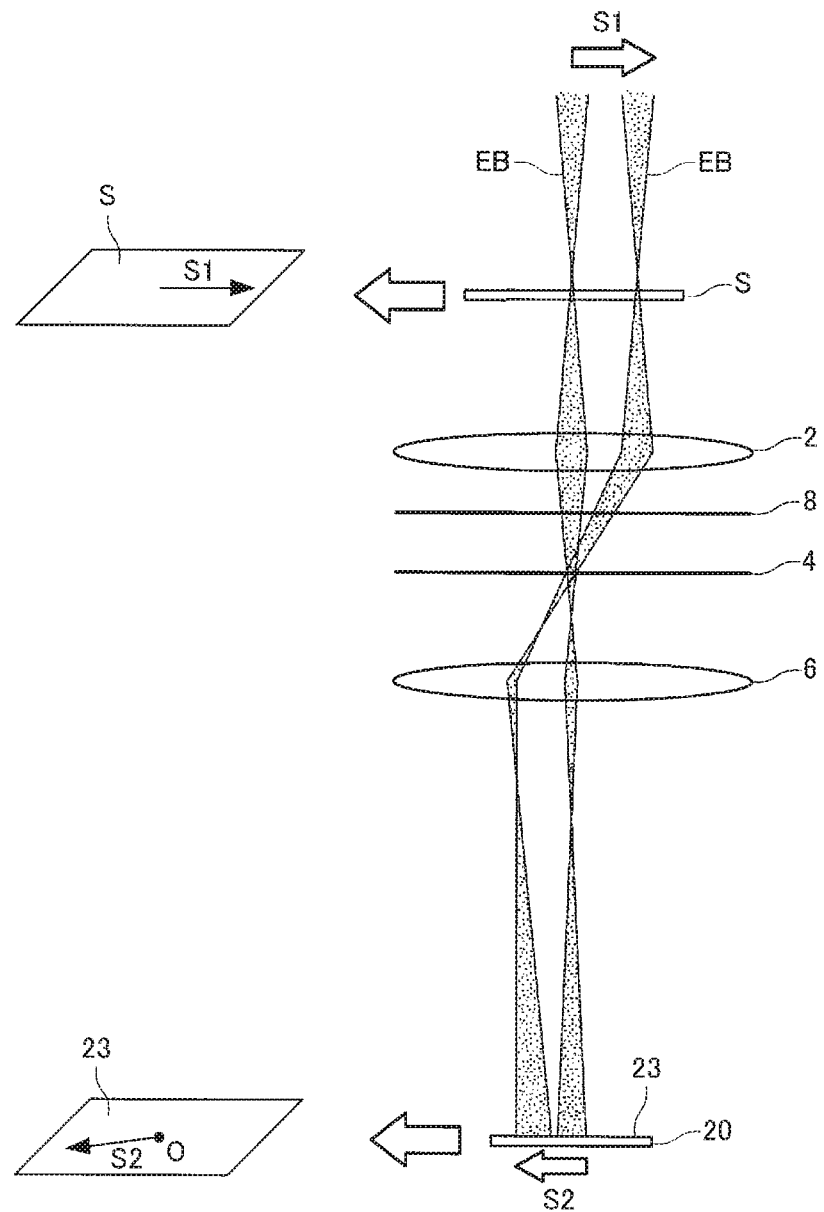
FIG. 7 is a diagram schematically illustrating a state where the focus of an imaging lens system is shifted from a diffraction plane.
Figure 8:
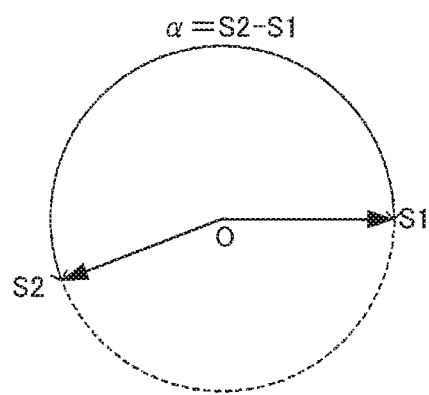
FIG. 8 is a diagram schematically illustrating the state where the focus of the imaging lens system is shifted from the diffraction plan.
Figure 9:
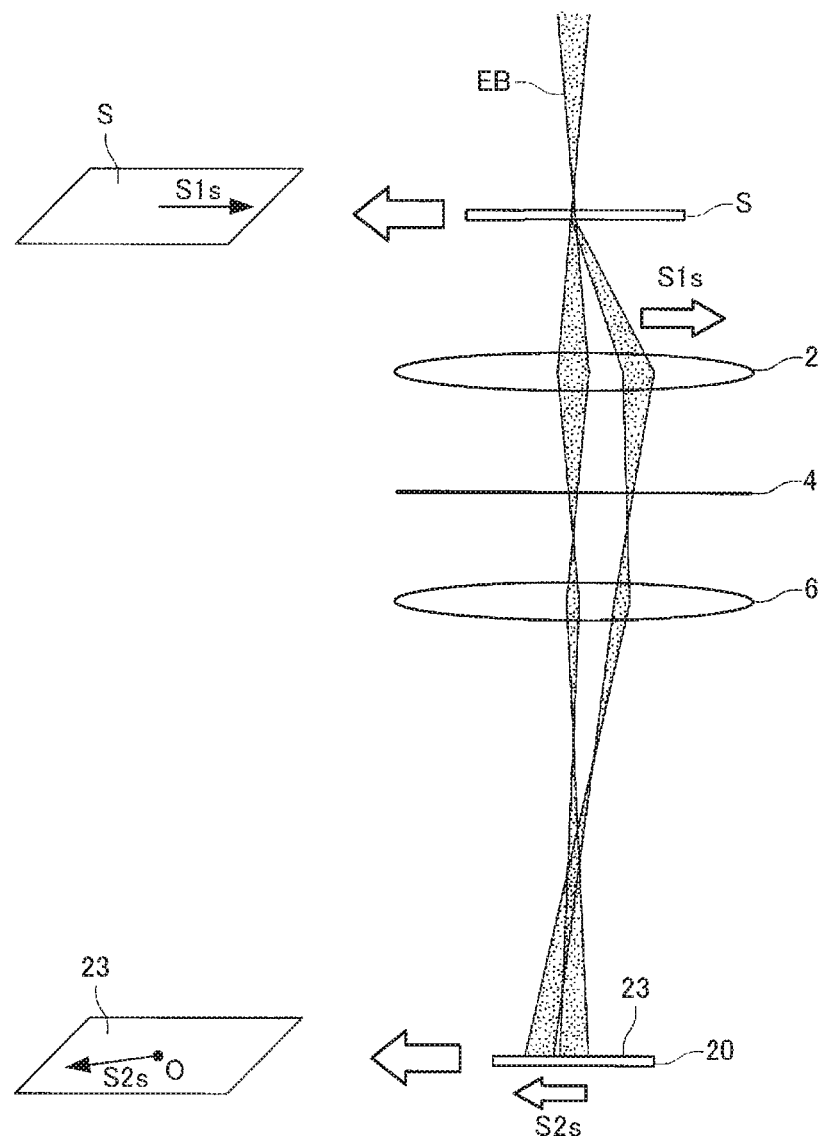
FIG. 9 is a diagram schematically illustrating a state where an electron beam is being deflected by the electromagnetic field of a sample.

FIG. 7 and FIG. 8 are diagrams schematically illustrating a state where the focus of the imaging lens system 6 is shifted from the diffraction plane 4. FIG. 9 is a diagram schematically illustrating a state where the electron beam EB is being deflected by the electromagnetic field of the sample S.

As illustrated in FIG. 7 and FIG. 8, when the imaging lens system 6 is weakly excited, the detection plane 23 becomes conjugate to a plane 8 shifted on the upper side (sample S side) of the diffraction plane 4. When the electron beam EB with which the sample S is illuminated is shifted under this state, the electron beam EB is also shifted on the detection plane 23. In the illustrated example, when the electron beam EB incident on the sample S is shifted in the direction S1, the electron beam EB is shifted in the direction S2 on the detection plane 23.

Here, as illustrated in FIG. 9, when the electron beam EB is shifted by the electromagnetic field of the sample S in a direction S1s that is the same direction as the direction S1, and the direction of shift of the electron beam EB on the detection plane 23 in this case is defined as a direction S2s, the direction S2s and the direction S2 are the same direction.

Thus, the direction (direction S2) of shift of the electron beam EB on the detection plane 23 that is caused when the electron beam EB incident on the sample S is shifted in the direction S1 can be calculated from a signal from each of the detection regions D1, D2, D3, and D4 similarly to measurement of the electromagnetic field of the sample S. From the direction S2 calculated in this way and the shift direction S1, the angle α (=S2−S1) formed by the direction S1 and the direction S2 can be obtained. From the angle α, the directions of the detection regions D1, D2, D3, and D4 of the segmented detector 20 in the STEM image can be obtained.

Figure 16:
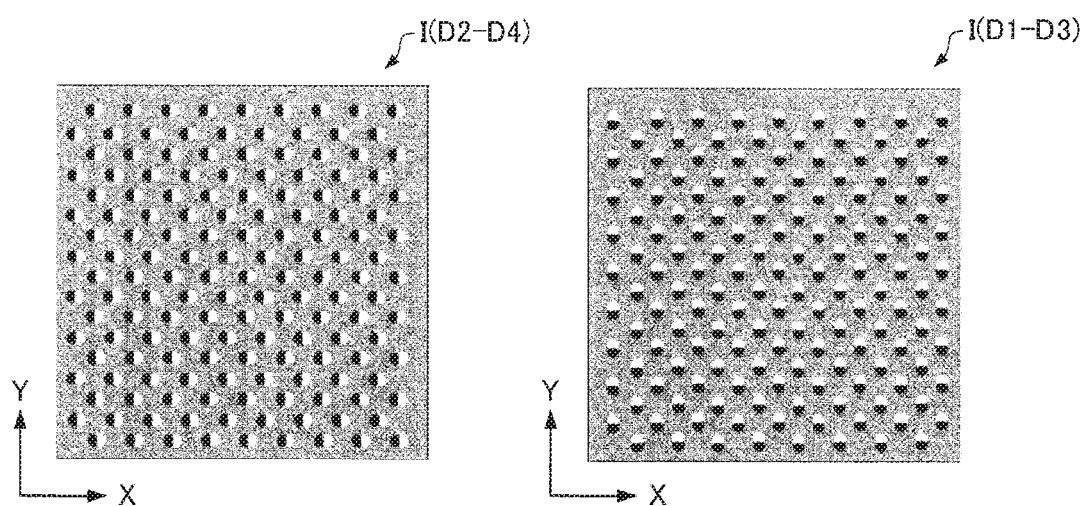
FIG. 16 is a diagram schematically illustrating an image I (D2-D4) and an image I (D1-D3).
Figure 17:
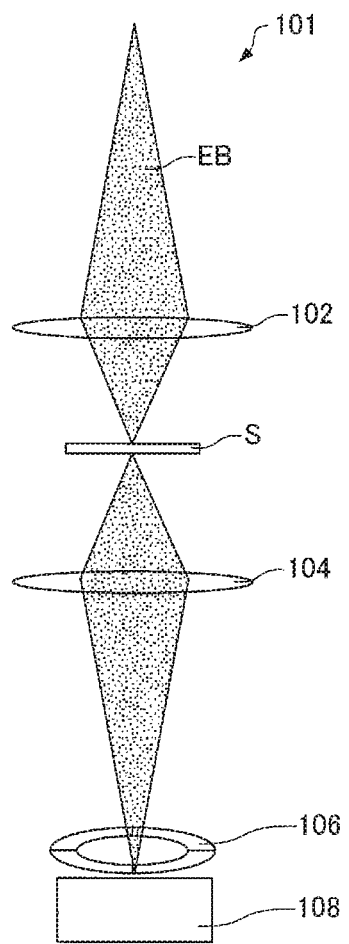
FIG. 17 is a diagram illustrating an example of the measurement method.
Figure 18:
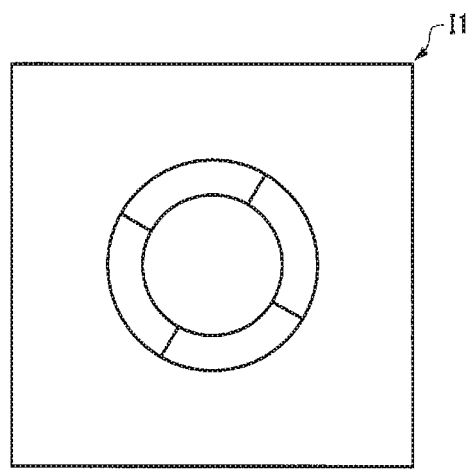
FIG. 18 is a diagram illustrating the example of the measurement method.
Figure 19:
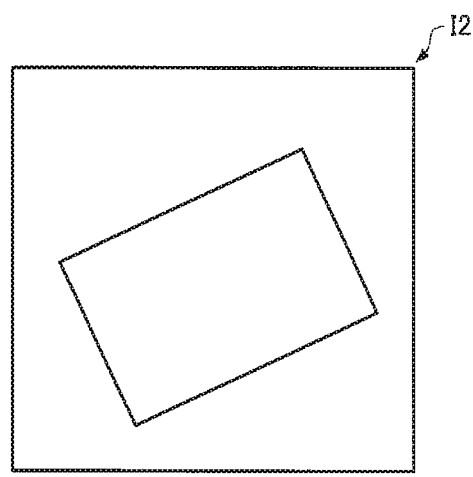
FIG. 19 is a diagram illustrating the example of the measurement method.
Figure 20:
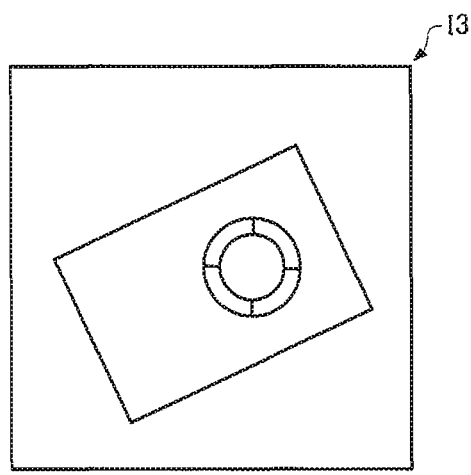
FIG. 20 is a diagram illustrating the example of the measurement method.
Figure 21:
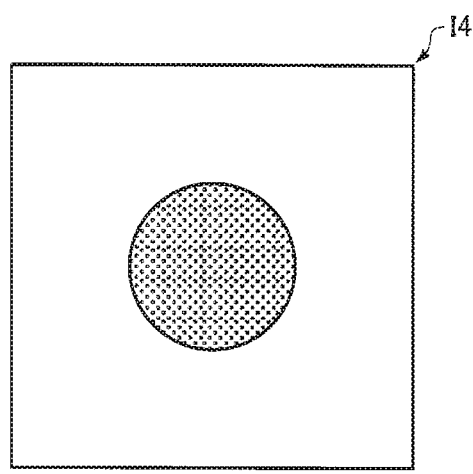
FIG. 21 is a diagram illustrating the example of the measurement method.
Figure 22:
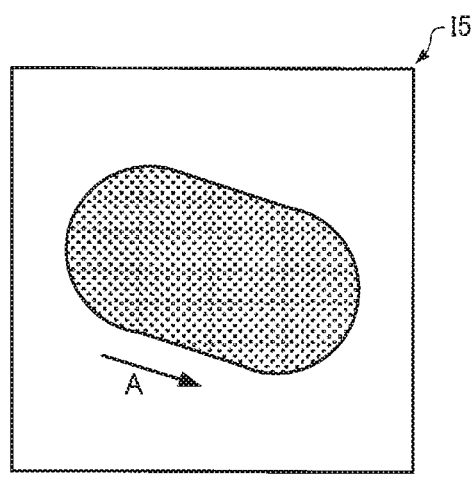
FIG. 22 is a diagram illustrating the example of the measurement method.
Figure 23:
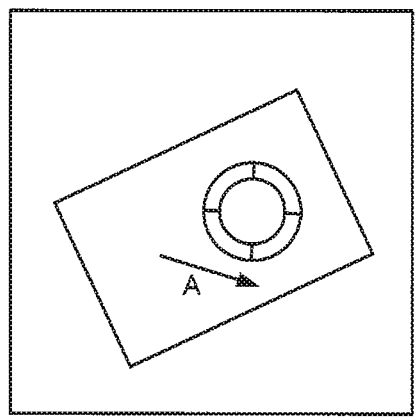
FIG. 23 is a diagram illustrating the example of the measurement method.

For example, when the deflection direction of the electron beam EB due to the electromagnetic field of the sample S, which is measured with the use of the segmented detector 20, is rotated by the angle α, information on deflection of the electron beam EB due to the sample S that is obtained from an image I (D2-D4), which is illustrated in FIG. 16, can be matched with the X direction of the STEM image. Further, information on deflection of the electron beam EB due to the sample S that is obtained from an image I (D1-D3), which is illustrated in FIG. 16, can be matched with the Y direction of the STEM image.

Further, for example, when the rotation unit 26 configured to rotate the four detection regions D1, D2, D3, and D4 rotates the detection regions D1, D2, D3, and D4 by the angle α, a direction in an obtained STEM image and the direction of deflection of the electron beam EB due to the sample S, which is measured with the use of the segmented detector 20, can be matched with each other.

The direction of shift of the electron beam EB on the detection plane 23 that is caused when the electron beam EB incident on the sample S is shifted may be measured repeatedly while the shift direction of the electron beam EB incident on the sample S is changed.

Figure 10:
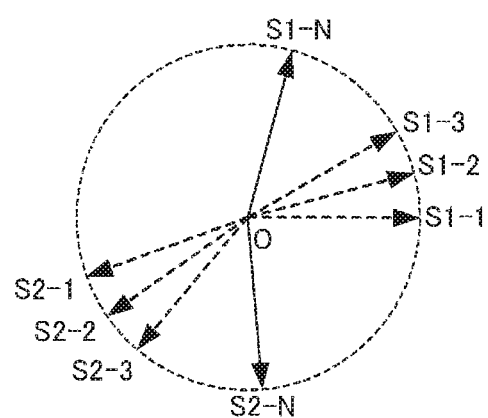
FIG. 10 is a diagram schematically illustrating a state where measurement of the shift direction of the electron beam on the detection plane is repeatedly performed while the shift direction of the electron beam incident on the sample is changed.

FIG. 10 is a diagram schematically illustrating a state where measurement of the shift direction of the electron beam EB on the detection plane 23 is repeatedly performed while the shift direction of the electron beam EB incident on the sample S is changed.

As illustrated in FIG. 10, after the electron beam EB incident on the sample S is shifted in a direction S1-1 and a shift direction (direction S2-1) of the electron beam EB on the detection plane 23 is measured, the electron beam EB incident on the sample S is shifted in a direction S1-2 that is different from the direction S1-1, and a shift direction (direction S2-2) of the electron beam EB on the detection plane 23 is measured. Next, the electron beam EB incident on the sample S is shifted in a direction S1-3 that is different from the direction S1-2, and a shift direction (direction S2-3) of the electron beam EB on the detection plane 23 is measured. By repeating this operation N times, an angle formed by the direction S1-1 and the direction S2-1, an angle formed by the direction S1-2 and the direction S2-2, an angle formed by the direction S1-3 and the direction S2-3, . . . , and an angle formed by a direction S1-N and a direction S2-N can be obtained. The obtained angles can be subjected to predetermined calculation (for example, averaging) to obtain the angle α.

In this way, when the direction of shift of the electron beam EB on the detection plane 23 that is caused when the electron beam EB incident on the sample S is shifted is measured repeatedly while the shift direction of the electron beam EB incident on the sample S is changed, the directions of the detection regions D1, D2, D3, and D4 of the segmented detector 20 in the STEM image can be obtained more accurately than in a case where the direction of shift of the electron beam EB on the detection plane 23 that is caused when the electron beam EB incident on the sample S is shifted is measured only in one direction. This measurement is desirably performed in the vacuum region where the sample S is not present. Even in a case where the measurement is performed in a region where the sample S is present, however, the effect of the sample S can be reduced when the measurement is repeatedly performed while the shift direction of the electron beam EB incident on the sample S is changed as described above.

Figure 11:
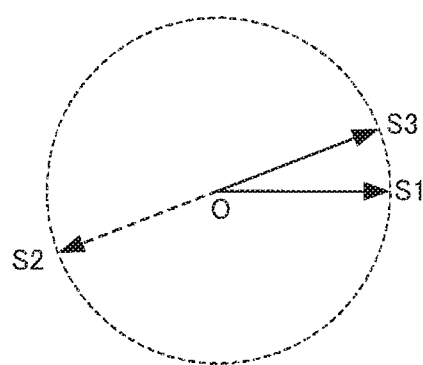
FIG. 11 is a diagram in which the shift directions on the detection plane in a case where the imaging lens system is strongly excited and a case where the imaging lens system is weakly excited are compared to each other.

Further, the case where the imaging lens system 6 is weakly excited is described above. In a case where the imaging lens system 6 is strongly excited, although not illustrated, the detection plane 23 becomes conjugate to a plane shifted on the lower side (detection plane 23 side) of the diffraction plane 4. Thus, as illustrated in FIG. 11, a shift direction (direction S3) on the detection plane 23 when the imaging lens system 6 is strongly excited and the shift direction (direction S2) on the detection plane 23 when the imaging lens system 6 is weakly excited are directions opposite to each other (directions with a difference of 180°). Given this point, also in the case where the imaging lens system 6 is strongly excited, the directions of the detection regions D1, D2, D3, and D4 of the segmented detector 20 in the STEM image can be obtained similarly to the case where the imaging lens system 6 is weakly excited. In this way, in the present embodiment, the angle α can be obtained by shifting (performing scan with) the electron beam EB incident on the sample S under the state where the focus of the imaging lens system 6 is shifted from the diffraction plane 4.

Here, when how the imaging lens system 6 is excited is changed, an image is rotated and the direction of shift on the detection plane 23 is shifted in some cases. In such a case, for example, the shift directions (direction S2 and direction S3) of the electron beam EB on the detection plane 23 for the case where the imaging lens system 6 is weakly excited and the case where the imaging lens system 6 is strongly excited are obtained. At this time, a difference between the amount of excitation (reference amount of excitation) of the imaging lens system 6 when the diffraction plane 4 and the detection plane 23 are conjugate to each other and the amount of excitation when the imaging lens system 6 is weakly excited, and a difference between the reference amount of excitation and the amount of excitation when the imaging lens system 6 is strongly excited are equal to each other. From the direction S2 and the direction S3 obtained in this way, the average of these values is calculated (for example, (S2−180+S3)/2) in consideration of the fact that the directions are directions opposite to each other (for example, one of the shift directions is rotated by −180°), and the angle α is obtained with the average value being a shift direction on the detection plane 23. With this, the effect of shift of a shift direction on the detection plane 23 that is caused when how the imaging lens system 6 is excited is changed can be reduced (preferably canceled out).

The method for reducing the effect of shift of the shift direction of the electron beam EB on the detection plane 23, which is caused when how the imaging lens system 6 is excited is changed, is not limited to the one described above. For example, the measurement of the shift direction of the electron beam EB on the detection plane 23 may be repeatedly performed while how the imaging lens system 6 is excited is changed. That is, the measurement of the shift direction of the electron beam EB on the detection plane 23 may be repeatedly performed while how the imaging lens system 6 is excited is changed (the focus is changed) to change the position of the plane 8 to which the detection plane 23 is conjugate. From a plurality of shift directions measured in this way, a shift direction on the detection plane 23 may be obtained with the use of a linear approximation, for example. With this, the effect of shift of the shift direction of the electron beam EB on the detection plane 23, which is caused when how the imaging lens system 6 is excited is changed, can be reduced.

The angle α has an error when, in the measurement of the direction of shift of the electron beam EB on the detection plane 23 that is caused when the electron beam EB incident on the sample S is shifted, the position of the electron beam EB on the detection plane 23 before the electron beam EB incident on the sample S is shifted is not matched with the center O of the detection plane 23. Thus, the position (vector) of the electron beam EB on the detection plane 23 when the shift amount of the electron beam EB incident on the sample S is zero is defined as a reference, and a difference between the position (vector) in question and a measured position (vector) of the electron beam EB on the detection plane 23 when the electron beam EB incident on the sample S is deflected by a predetermined amount is calculated. In this way, the angle α can be more accurately obtained.

The measurement method according to the present embodiment has the following features, for example.

The measurement method according to the present embodiment includes: the step of measuring the shift direction of the electron beam EB on the detection plane 23 with the segmented detector 20, by shifting the electron beam EB incident on the sample S under the state where the detection plane 23 of the segmented detector 20 is conjugate to the plane 8 shifted from the diffraction plane 4, to thereby shift the electron beam EB on the detection plane 23; and the step of obtaining, from the shift direction of the electron beam EB on the detection plane 23, the directions of the detection regions D1, D2, D3, and D4 in the STEM image. Thus, with the measurement method according to the present embodiment, the directions of the detection regions D1, D2, D3, and D4 in the STEM image can be easily measured. Further, with the measurement method according to the present embodiment, the directions of the detection regions D1, D2, D3, and D4 in the STEM image can be measured without using a device such as a CCD camera.

In the measurement method according to the present embodiment, the electron beam EB incident on the sample S is repeatedly shifted and a direction in which the electron beam EB is shifted is changed every time the electron beam EB is shifted. Thus, the directions of the detection regions D1, D2, D3, and D4 in the STEM image can be more accurately measured.

In the measurement method according to the present embodiment, the electron beam EB incident on the sample S is repeatedly shifted, and every time the electron beam EB is shifted, the position of the plane 8 to which the detection plane 23 is conjugate through adjustment of the imaging lens system 6 is changed. With this, the effect of shift of the shift direction of the electron beam EB on the detection plane 23, which is caused when how the imaging lens system 6 is excited is changed, can be reduced.

3. Operation of Electron Microscope

Figure 12:
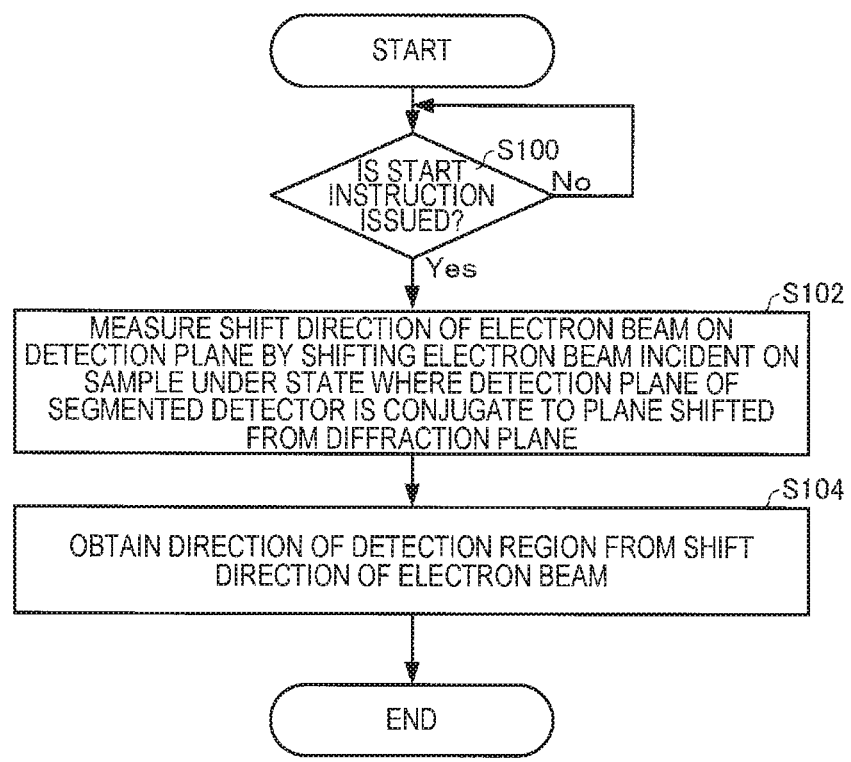
FIG. 12 is a flowchart illustrating an example of the flow of processing by a processing unit in the electron microscope.

Next, the operation of the electron microscope 100 is described. The electron microscope 100 can automatically perform measurement by the measurement method described above. FIG. 12 is a flowchart illustrating an example of the flow of processing by the processing unit 40 (computation unit 46) in the electron microscope 100.

First, the computation unit 46 determines whether the user issues an instruction (start instruction) to start measurement or not (S100), and waits until the user issues a start instruction (No in S100). The computation unit 46 determines that the user issues a start instruction when receiving a start instruction as input via the operation unit 50, for example.

When the computation unit 46 determines that the user issues a start instruction (Yes in S100), the computation unit 46 obtains the result of measurement, by the segmented detector 20, of the shift direction of the electron beam EB on the detection plane 23, by shifting the electron beam EB incident on the sample S under a state where, with the use of the imaging lens system 6, the detection plane 23 is conjugate to the plane 8 shifted from the diffraction plane 4, to thereby shift the electron beam EB on the detection plane 23 (S102).

Specifically, the computation unit 46 adjusts, via the control unit 42, the intermediate lens 15 and the projection lens 16 (imaging lens system 6) so that the detection plane 23 is conjugate to the plane 8 shifted from the diffraction plane 4. Then, the computation unit 46 operates, via the control unit 42, the scanning deflector 12 to shift (perform scan with) the electron beam EB incident on the sample S in a predetermined direction (for example, direction S1). With this, the electron beam EB is shifted on the detection plane 23. The computation unit 46 obtains the shift direction of the electron beam EB on the detection plane 23 from signals from the detection regions D1, D2, D3, and D4 of the segmented detector 20 at this time.

Next, the computation unit 46 obtains the angle α from the obtained shift direction of the electron beam EB on the detection plane 23, thereby obtaining the directions of the detection regions D1, D2, D3, and D4 in the STEM image (S104).

The computation unit 46 may rotate the rotation unit 26 of the segmented detector 20 on the basis of the detection regions D1, D2, D3, and D4 (angle α) in the STEM image, for example. With this, for example, a direction connecting the detection region D2 and the detection region D4, and the X direction of the STEM image can be matched with each other, and a direction connecting the detection region D1 and the detection region D3, and the Y direction of the STEM image can be matched with each other.

Further, the image processing unit 44 may generate, for example, an image (DPC image) representing the distribution of the electromagnetic field of the sample S obtained by the DPC method on the basis of the detection regions D1, D2, D3, and D4 (angle α) in the STEM image, which are obtained by the computation unit 46. With this, it is possible to easily make the DPC image and the STEM image correspond to each other.

The computation unit 46 may repeatedly shift the electron beam EB incident on the sample S and change a direction in which the electron beam EB is shifted every time the electron beam EB is shifted.

Further, the computation unit 46 may repeatedly shift the electron beam EB incident on the sample S, and every time the electron beam EB is shifted, change the position of the plane 8 to which the detection plane 23 is conjugate.

The electron microscope 100 has the following features, for example.

In the electron microscope 100, the computation unit 46 performs the processing of: obtaining the result of measurement, by the segmented detector 20, of the shift direction of the electron beam EB on the detection plane 23, by shifting the electron beam EB incident on the sample S under the state where, with the use of the imaging lens system 6, the detection plane 23 is conjugate to the plane 8 shifted from the diffraction plane 4, to thereby shift the electron beam EB on the detection plane 23; and obtaining, from the obtained shift direction of the electron beam EB on the detection plane 23, the directions of the detection regions D1, D2, D3, and D4 in the STEM image. Thus, in the electron microscope 100, the directions of the detection regions D1, D2, D3, and D4 in the STEM image can be easily measured. Further, in the electron microscope 100, the directions of the detection regions D1, D2, D3, and D4 in the STEM image can be measured without using a device such as a CCD camera.

4. Modifications

The invention is not limited to the embodiments described above, and can be modified variously within the scope of the invention.

In the embodiments described above, the shift direction of the electron beam EB on the detection plane 23 is measured by the segmented detector 20, by shifting the electron beam EB incident on the sample S under the state where, with the use of the imaging lens system 6, the detection plane 23 is conjugate to the plane 8 shifted from the diffraction plane 4, to thereby shift the electron beam EB on the detection plane 23.

In contrast to this, in a modification, the shift direction of the electron beam EB on the detection plane 23 is measured by the segmented detector 20, by scanning the incident angle of the electron beam incident on the sample S to shift the electron beam EB on the detection plane 23.

Figure 13:
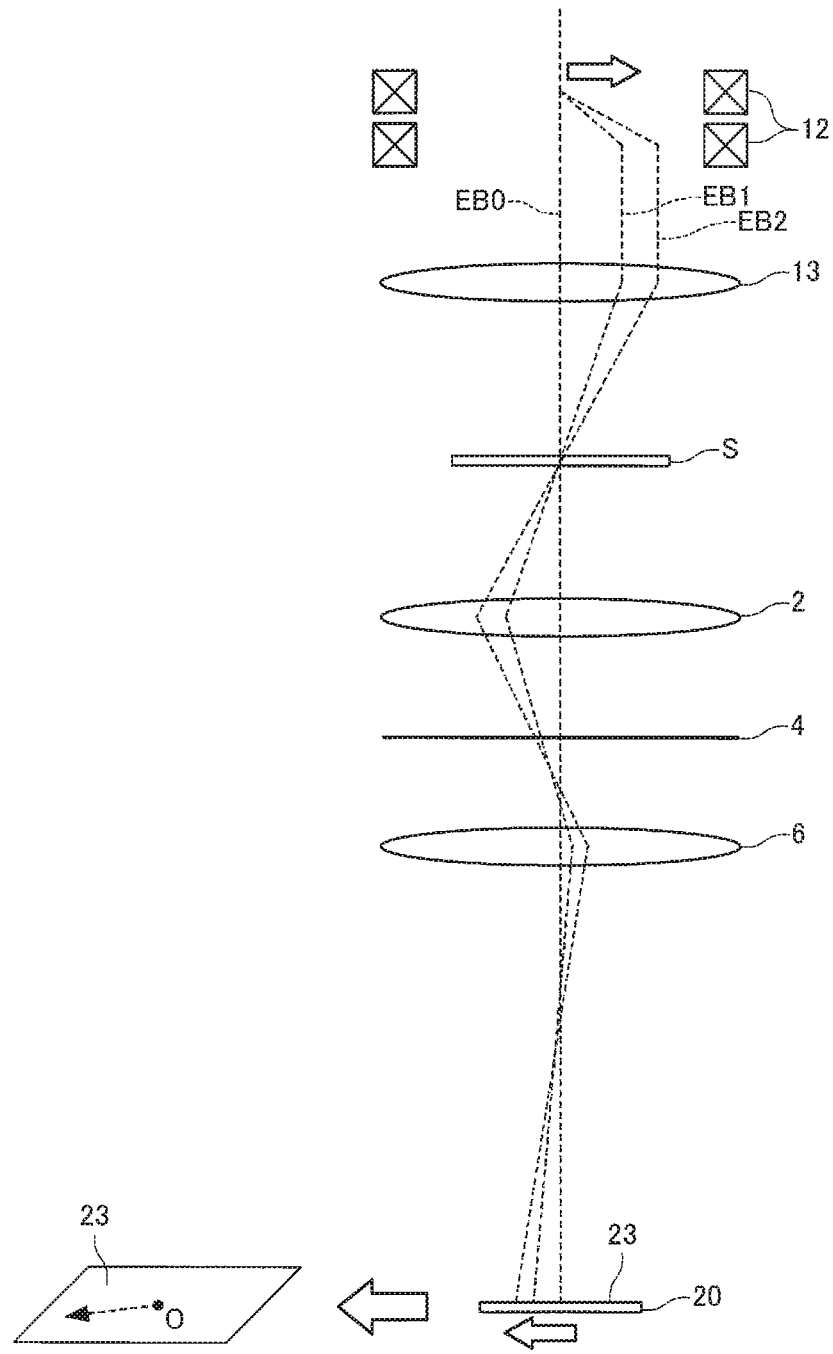
FIG. 13 is a diagram schematically illustrating a state where an incident angle of the electron beam incident on the sample is being scanned.
Figure 14:
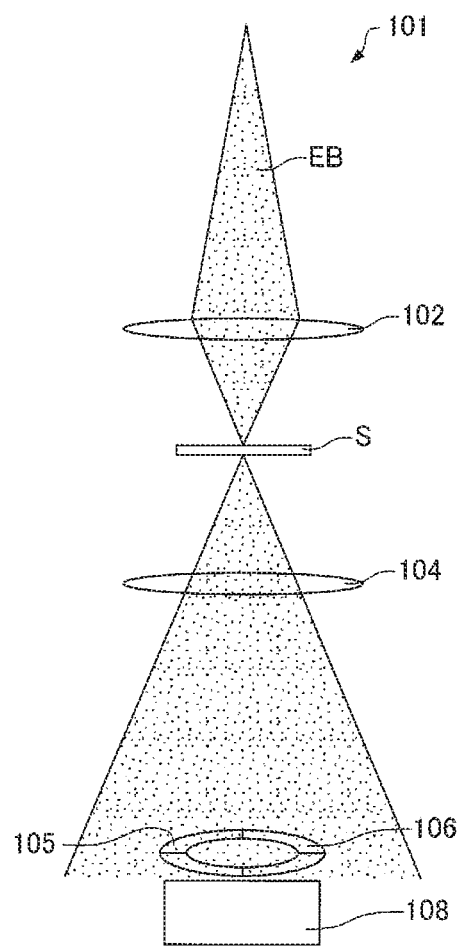
FIG. 14 is a diagram illustrating the operation of a related-art scanning transmission electron microscope including a segmented detector.
Figure 15:
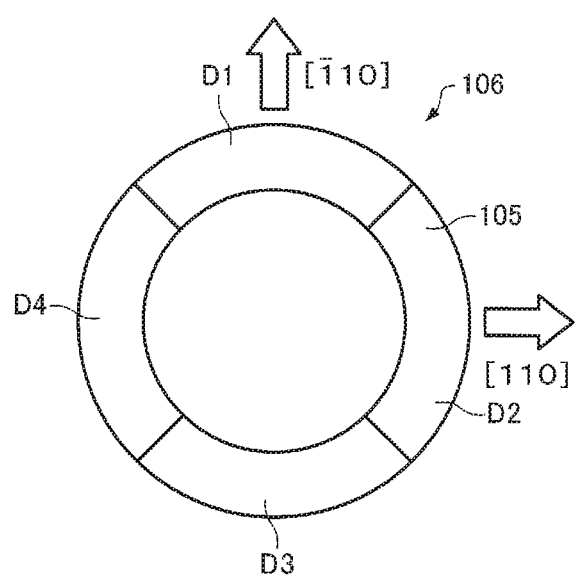
FIG. 15 is a diagram illustrating an example of the relationship between the crystal orientations of the sample and the relative orientations of the detection regions of the segmented detector.

FIG. 13 is a diagram schematically illustrating a state where the incident angle of the electron beam EB incident on the sample S is being scanned. In this modification, the diffraction plane 4 and the detection plane 23 are conjugate to each other through adjustment of the imaging lens system 6. Further, FIG. 13 illustrates electron beams EB0, EB1, and EB2 having incident angles different from each other.

The electron beams EB0, EB1, and EB2 that has entered the sample S to pass through the sample S enter the diffraction plane 4 at different positions depending on incident angles. The scanning deflector 12 scans the incident angle of the electron beam EB incident on the sample S. Here, the incident angle is changed while the position of the electron beam EB incident on the sample S is not changed, that is, the position of the electron beam EB is kept at one point.

The diffraction plane 4 and the detection plane 23 are conjugate planes through adjustment of the imaging lens system 6, and hence the electron beams EB0, EB1, and EB2 enter the detection plane 23 at different positions on the detection plane 23 depending on incident angles. In the example illustrated in FIG. 13, an electron beam having a larger incident angle enters the detection plane 23 at a position farther from the center O of the detection plane 23.

By scanning the incident angle of the electron beam EB incident on the sample S by the scanning deflector 12 in this way, the shift direction of the electron beam EB can be measured on the detection plane 23 by the segmented detector 20 similarly to the case where the electron beam EB incident on the sample S is shifted under the state where the detection plane 23 is conjugate to the plane 8 shifted from the diffraction plane 4. This means that, also in this modification, similarly to the embodiments described above, the angle α can be obtained, and the directions of the detection regions D1, D2, D3, and D4 in the STEM image can be measured.

In addition to the incident angle of the electron beam EB incident on the sample S with respect to the sample S, an azimuthal angle may be scanned.

A deflector other than the scanning deflector 12 may scan the incident angle of the electron beam EB incident on the sample S. In this case, the result of measurement performed by the other deflector may be applied to the scanning deflector 12.

According to this modification, actions and effects similar to those of the embodiments described above can be provided.

Further, in the electron microscope 100, the measurement method according to this modification can be automatically performed. Specifically, in the embodiments described above, the computation unit 46 performs the processing (processing in Step S102 of FIG. 12) of shifting the electron beam EB incident on the sample S under the state where the detection plane 23 is conjugate to the plane 8 shifted from the diffraction plane 4 to shift the electron beam EB on the detection plane 23, and obtaining the result of measuring the shift direction of the electron beam EB on the detection plane 23 with the segmented detector 20. In contrast to this, in this modification, in place of the processing in Step S102, the computation unit 46 performs the processing of scanning the incident angle of the electron beam EB incident on the sample S to shift the electron beam EB on the detection plane 23, and obtaining the result of measuring the shift direction of the electron beam EB on the detection plane 23 with the segmented detector 20. With this, similarly to the embodiments described above, the directions of the detection regions D1, D2, D3, and D4 in the STEM image can be easily measured.

It should be noted that the embodiments and the modifications described above are merely examples and the invention is not limited thereto. For example, the respective embodiments and the respective modifications may be combined as appropriate.

The invention includes configurations that are substantially the same as the configurations described in the embodiments (for example, a configuration having the same function, method and result or a configuration having the same objective and effect). The invention also includes configurations in which non-essential elements described in the embodiments have been replaced by other elements. The invention further includes configurations having the same effects as those of the configurations described in the embodiments, or configurations capable of achieving the same objectives as those of the configurations described in the embodiments. Moreover, the invention includes configurations in which known art is added to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A measurement method for measuring, in an electron microscope including a segmented detector having a detection plane segmented into a plurality of detection regions, a direction of each of the plurality of detection regions in a scanning transmission electron microscope (STEM) image, the measurement method comprising:

shifting an electron beam incident on a sample under a state where the detection plane is conjugate to a plane shifted from a diffraction plane to shift the electron beam on the detection plane, and measuring a shift direction of the electron beam on the detection plane with the segmented detector; and obtaining the direction of each of the plurality of detection regions in the STEM image from the shift direction.

2. The measurement method according to claim 1,
wherein measuring the shift direction with the segmented detector includes repeatedly shifting the electron beam incident on the sample and changing a direction in which the electron beam is shifted every time the electron beam is shifted.

3. The measurement method according to claim 1,
wherein measuring the shift direction with the segmented detector includes repeatedly shifting the electron beam incident on the sample and changing a position of a plane to which the detection plane is conjugate, every time the electron beam is shifted.

4. The measurement method according to claim 1,
wherein the electron microscope includes an imaging lens system that forms an image on the detection plane with the electron beam having passed through the sample, and wherein the imaging lens system is used to make the detection plane conjugate to the plane shifted from the diffraction plane.

5. The measurement method according to claim 1,
wherein the electron microscope includes a scanning deflector that performs scan on the sample with an electron beam emitted from an electron source, and wherein the scanning deflector shifts the electron beam incident on the sample.

6. A measurement method for measuring, in an electron microscope including a segmented detector having a detection plane segmented into a plurality of detection regions, a direction of each of the plurality of detection regions in a scanning transmission electron microscope (STEM) image, the measurement method comprising:

scanning an incident angle of an electron beam incident on a sample to shift the electron beam on the detection plane, and measuring a shift direction of the electron beam on the detection plane with the segmented detector; and obtaining the direction of each of the plurality of detection regions in the STEM image from the shift direction.

7. The measurement method according to claim 6,
wherein the electron microscope includes a scanning deflector that performs scan on the sample with an electron beam emitted from an electron source, and wherein the scanning deflector scans the incident angle of the electron beam incident on the sample.

8. An electron microscope that detects an electron having passed through a sample to obtain a scanning transmission electron microscope (STEM) image,
the electron microscope comprising:

a segmented detector having a detection plane for detecting an electron beam having passed through the sample, the detection plane being segmented into a plurality of detection regions; and a computation unit that obtains a direction of each of the plurality of detection regions in the STEM image, and the computation unit performing processing of:

shifting an electron beam incident on the sample under a state where the detection plane is conjugate to a plane shifted from a diffraction plane to shift the electron beam on the detection plane, and obtaining a result of measuring a shift direction of the electron beam on the detection plane with the segmented detector; and obtaining the direction of each of the plurality of detection regions in the STEM image from the obtained shift direction.

9. An electron microscope that detects an electron having passed through a sample to obtain a scanning transmission electron microscope (STEM) image,
the electron microscope comprising:

a segmented detector having a detection plane for detecting an electron beam having passed through the sample, the detection plane being segmented into a plurality of detection regions; and a computation unit that obtains a direction of each of the plurality of detection regions in the STEM image, and the computation unit performing processing of:

scanning an incident angle of an electron beam incident on the sample to shift the electron beam on the detection plane, and obtaining a result of measuring a shift direction of the electron beam on the detection plane with the segmented detector; and obtaining the direction of each of the plurality of detection regions in the STEM image from the obtained shift direction.

* * * * *